United States Patent
Krivokapic

(10) Patent No.: US 7,202,118 B1
(45) Date of Patent: Apr. 10, 2007

(54) FULLY DEPLETED SOI MOSFET ARRANGEMENT WITH SUNKEN SOURCE/DRAIN REGIONS

(75) Inventor: Zoran Krivokapic, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 204 days.

(21) Appl. No.: 10/460,402

(22) Filed: Jun. 13, 2003

(51) Int. Cl.
*H01L 21/84* (2006.01)
*H01L 21/00* (2006.01)

(52) U.S. Cl. .............. 438/151; 438/157; 438/197; 438/283; 438/300

(58) Field of Classification Search .......... 438/164, 438/165, 222, 283, 406, 412, 455, 459; 257/347–351, 257/365, 401
See application file for complete search history.

(56) References Cited

U.S. PATENT DOCUMENTS

| | | | | |
|---|---|---|---|---|
| 5,164,805 A | * | 11/1992 | Lee | 257/351 |
| 5,273,921 A | * | 12/1993 | Neudeck et al. | 438/157 |
| 5,646,058 A | * | 7/1997 | Taur et al. | 438/283 |
| 6,350,653 B1 | * | 2/2002 | Adkisson et al. | 438/258 |
| 6,365,465 B1 | * | 4/2002 | Chan et al. | 438/283 |
| 6,483,156 B1 | * | 11/2002 | Adkisson et al. | 257/401 |
| 6,657,261 B2 | * | 12/2003 | Assaderaghi et al. | 257/354 |
| 6,677,646 B2 | * | 1/2004 | Ieong et al. | 257/347 |
| 6,717,216 B1 | * | 4/2004 | Baie et al. | 257/347 |
| 6,835,981 B2 | * | 12/2004 | Yamada et al. | 257/347 |

* cited by examiner

*Primary Examiner*—Duy-Vu N. Deo

(57) ABSTRACT

A fully depleted SOI MOSFET arrangement includes a buried oxide (BOX) layer with recesses in the BOX layer and a post extended upwardly between the recesses. A thin channel region is formed on the post and a gate over the channel. Deep source/drain region are adjacent to the channel region and extend into the recesses.

11 Claims, 6 Drawing Sheets

FULLY DEPLETED SOI MOSFET ARRANGEMENT WITH SUNKEN SOURCE/DRAIN REGIONS

FIELD OF THE INVENTION

The present invention relates to the field of semiconductor manufacturing, and more particularly, to the formation of a fully depleted SOI MOSFET arrangement.

BACKGROUND OF THE INVENTION

As is known in the art, transistors such as metal oxide silicon (MOS) transistors have been formed in isolated regions of a semiconductor body such as an epitaxial layer which is itself formed on a semiconductor, typically a bulk silicon substrate. With an n-channel MOS field effect transistor (FET), the body is of p-type conductivity and the source and drain regions are formed in the p-type conductivity body as $N^+$ type conductivity regions. With a p-channel MOSFET, the body, or epitaxial layer, is of n-type conductivity and the source and drain regions are formed in the n-type conductivity body as $P^+$ conductivity regions. It has been suggested that the semiconductor body, or layer, be formed on an insulating substrate or over an insulation layer formed in a semiconductor substrate. Such technology sometimes is referred to as silicon-on-insulator (SOI) technology. Silicon-on-insulator MOS technologies have a number of advantages over bulk silicon MOS transistors. These advantages include: reduced source/drain capacitance; improved speed performance in higher-operating frequencies; reduced $N^+$ to $P^+$ spacing and hence higher packing density due to ease of isolation; and higher "soft error" upset immunity (i.e., immunity to the effects of alpha particle strikes).

Silicon-on-insulator technology is characterized by the formation of a thin silicon layer for formation of the active devices over an insulating layer, such as an oxide, which is in turn formed over a substrate. Transistor sources and drains are formed by, for example, by implantation into the silicon layer while transistor gates are formed by forming a patterned oxide and conductor (e.g., metal) layer structure. Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). However, the floating body can introduce dynamic instabilities in the operation of such a transistor.

Conventional SOI FET's have floating bodies in which the body or channel region of the FET is located on an insulator and not electrically connected to a fixed potential. These devices are known as partially depleted SOI devices and have the aforementioned advantages and disadvantages. Fully depleted SOI devices are those in which the layer of semiconductor is sufficiently thin, such that the entire thickness of the body regions is depleted of majority carriers when in the off state and both diffusions are at ground. Fully depleted devices offer additional advantages such as reduced short channel effect, increased transconductance and reduced threshold voltage sensitivity to changes and body doping. Furthermore, the kink effects and threshold voltage shifts caused by body charging in partially depleted devices are reduced.

One of the concerns with providing a fully depleted SOI MOSFET is the difficulty of in providing deep source/drain regions while at the same time maintaining the thickness of the body region sufficiently thin so that they are depleted of majority carriers when in the off state and both diffusions are at ground.

SUMMARY OF THE INVENTION

There is a need for a fully depleted SOI MOSFET that also have deep source/drain regions and a method for making the same.

These and other needs are met by embodiments of the present invention which provide a method of forming a fully depleted semiconductor-on-insulator (SOI) MOSFET arrangement comprising the steps of forming a mask on a silicon layer of an SOI precursor having a buried oxide (BOX) layer and the silicon layer on the box layer. The silicon layer and a portion of the BOX layer are etched in accordance with a mask to create recessed regions and a post in the BOX layer. The silicon source/drain regions are formed in the recess. A silicon channel region is formed on the post. A gate is then formed on the silicon channel region and dopants are implanted into the silicon source/drain regions.

The earlier stated need is also met by embodiments of the present invention which provide a fully depleted SOI MOSFET arrangement comprising a buried oxide (BOX) layer with recesses in the BOX layer and a post extending upwardly between the recesses. The channel region is on the post and a gate is on the channel region. Silicon source/drain regions are provided adjacent to the channel region and extend into the recesses.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses problems related to fully depleted SOI MOSFETs and the formation of such fully depleted SOI MOSFETs. The present invention achieves this, in part, by forming a mask on a silicon layer of an SOI precursor having a buried oxide (BOX) layer and the silicon layer on the BOX layer. The silicon layer and a portion of the BOX layer are etched in accordance with the mask to create recessed regions and a post in the BOX layer. The silicon channel region is formed on the post and silicon source/drain regions are formed in the recesses. A metal gate is formed on the silicon channel region and dopants are implanted into the silicon source/drain regions. This structure allows a thin silicon channel region to be formed that is less than approximately 10 nm thick, while at the same time providing recessed regions for the deep source/drain regions to be formed.

Figure 1:
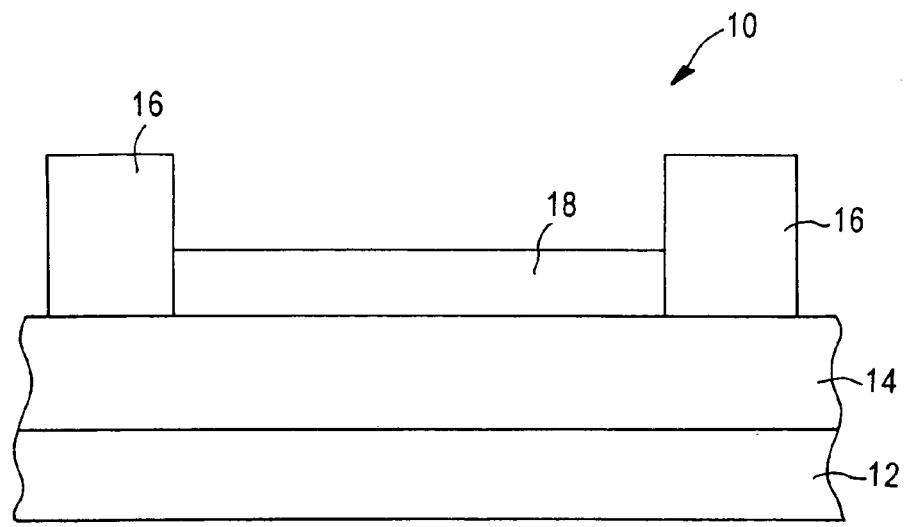
FIGS. 1–11 schematically depict sequential processing steps for forming a fully depleted SOI MOSFET arrangement in accordance with embodiments of the present invention.

FIG. 1 depicts an SOI precursor 10 that may be formed in any of a number of conventional techniques known to those of ordinary skill in the art. As such, the particular formation of this precursor 10 will not be described. The precursor 10 has a silicon substrate 12 and a buried oxide (BOX) layer 14 on top of the substrate 12. In exemplary embodiments of the invention, the BOX layer 14 has a thickness of approximately 200 nm. This thickness is exemplary only, as other thicknesses of the BOX layer 14 may be employed without departing from the scope of the invention.

The section of the precursor 10 that is depicted in FIG. 1 has shallow trench isolation (STI) structures 16 which serve to isolate the subsequently formed MOSFET from other devices on the die. A silicon layer 18 is formed on the BOX layer 14 and between the STI structures 16. The silicon layer 18 is between approximately 20 nm to approximately 30 nm thick in exemplary embodiments of the invention. The STI structures 16 are made of an oxide, for example.

Figure 2:
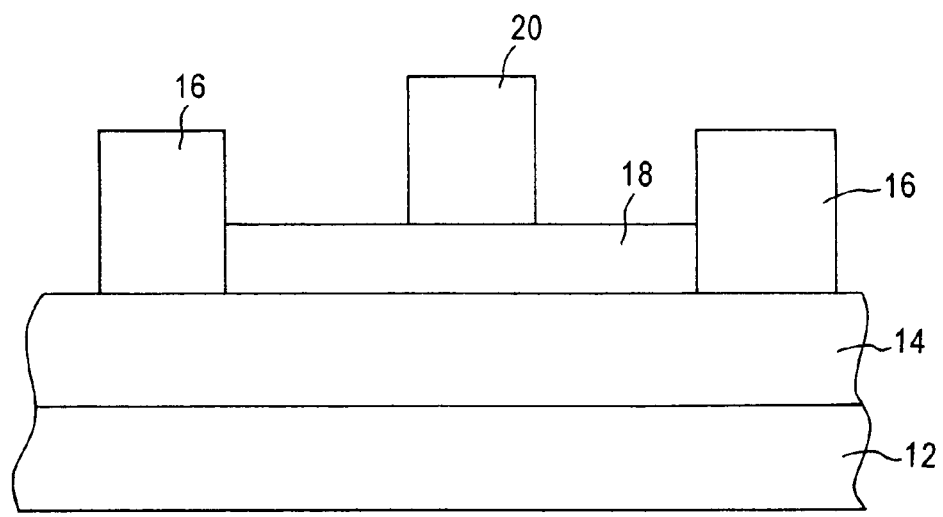

In FIG. 2, a mask 20 has been formed by conventional deposition, lithographic and etching techniques on the silicon layer 18. In certain preferred embodiments of the invention, the mask 20 is made of nitride, for example. Other suitable materials may be employed without departing from the scope of the invention as will be recognized by one of ordinary skill in the art. The formation of the mask 20 may be accomplished by depositing a nitride layer over the precursor 10, forming a resist mask over the nitride layer and patterning the mask. The nitride layer is then etched in accordance with photoresist mask to leave the mask 20. Photoresist is then removed, leaving the structure of FIG. 2.

Figure 3:
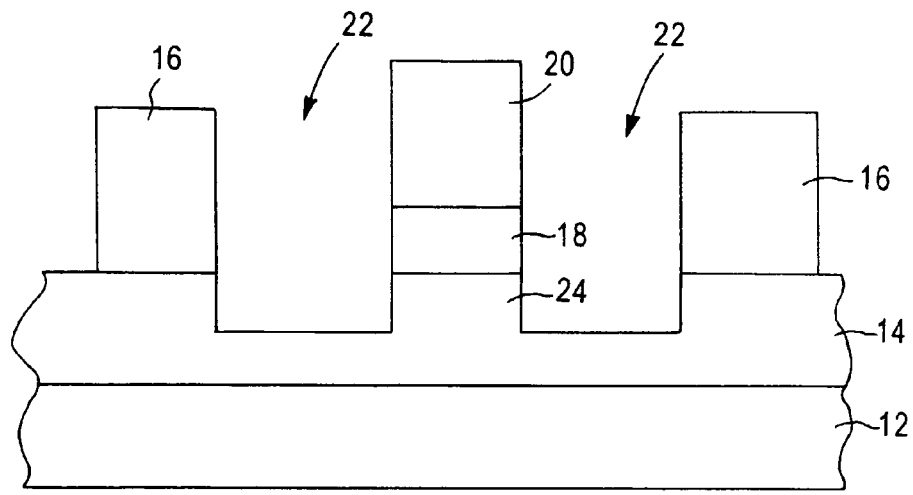

In FIG. 3, an anisotrophic etch has been performed to etch the silicon layer 18 and a portion of the BOX layer 14. For example, when the BOX layer 14 is approximately 200 nm thick, approximately 100 nm of the BOX layer 14 may be removed. This creates recesses 22 and a post on the BOX layer 24. The mask 20 protects the silicon layer 18 directly underneath the mask 20 during the etching process. A conventional etching recipe may be used to etch the silicon layer 18 and the BOX layer 24 in a single or multiple steps. During the etch, the mask 20 acts as a hard mask.

Figure 4:
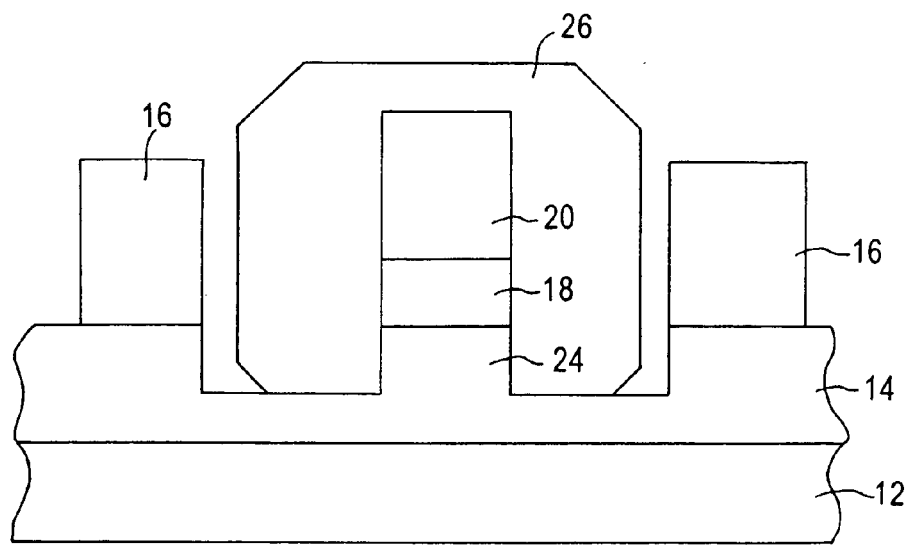

FIG. 4 shows the structure of FIG. 3 following the epitaxial growth of silicon 26. In certain preferred embodiments of the invention, the amount of silicon grown is between approximately 300 nm to approximately 500 nm thick. A conventional technique for growing the epitaxial silicon 26 may be employed.

Figure 5:
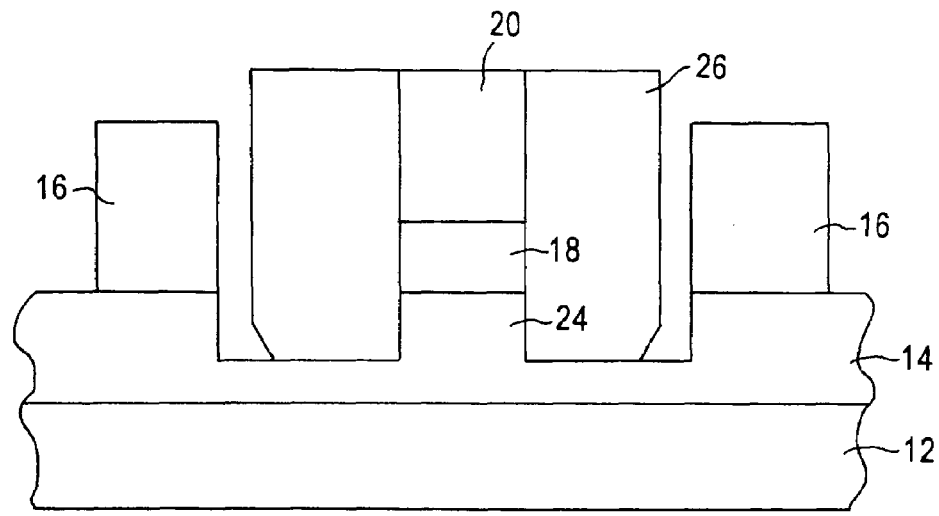
Figure 6:
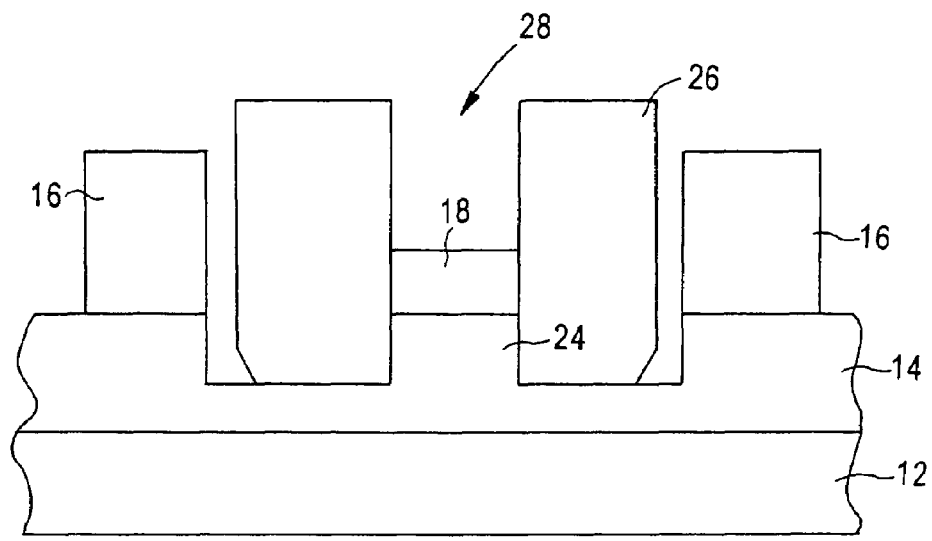

A polishing step is then performed, such as chemical mechanical planarization (CMP). The polishing is performed until the mask 20 is reached. The results of the polishing are depicted in structure of FIG. 5. In FIG. 6, the mask 20 is removed, leaving a gate recess 28 behind. When the mask 20 is a nitride, for example, the mask 20 may be removed by hot phosphoric acid, for example.

Figure 7:
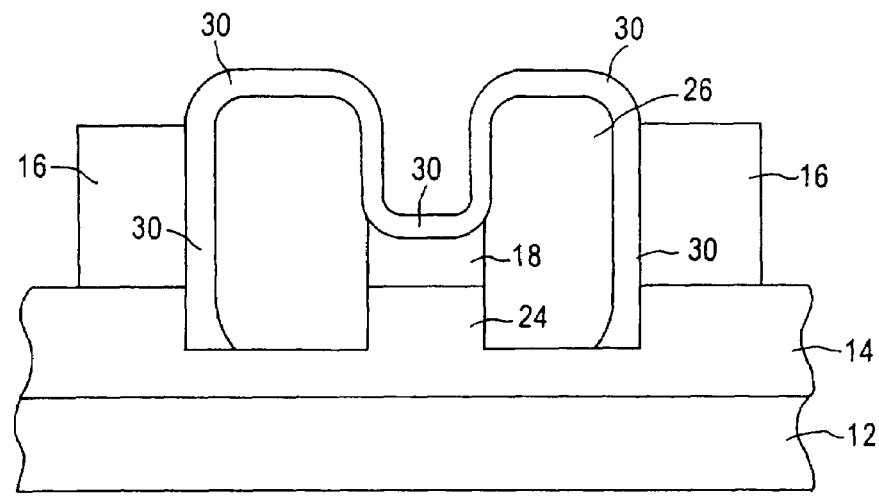

The epitaxial silicon 26 and the silicon layer 18 are then oxidized by conventional techniques to form an oxidized region 30. The oxidation should be such to thin down the silicon layer to less than approximately 20 nm, and in certain preferred embodiments, to between about 5 to about 10 nm. Conventional oxidation processes for oxidizing silicon are known to those of ordinary skill in the art. This structure is depicted in FIG. 7.

Figure 8:
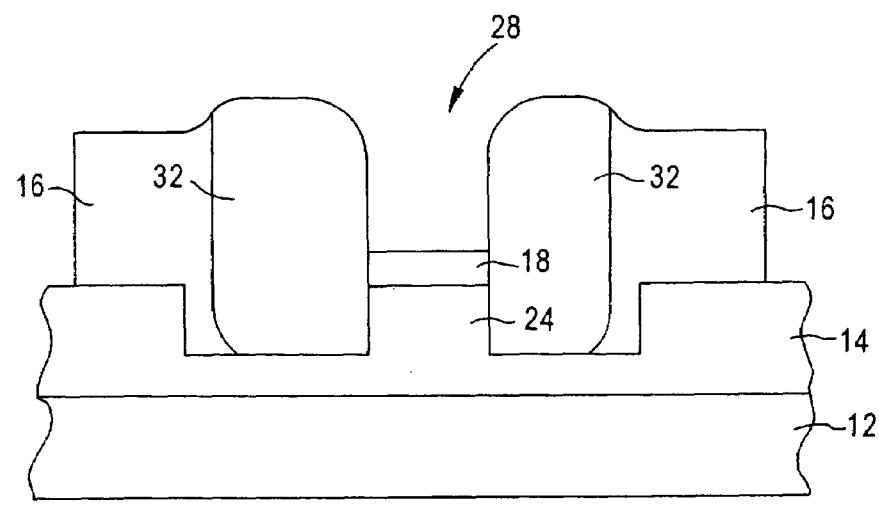

In FIG. 8 an anisotropic etch is performed to remove oxide from the top of the wafer. This creates the silicon channel region 30 underlying the gate recess 28. Deep source/drain regions 32 are located on either side of the silicon channel region 30. A conventional anisotropic etch, such as reactive ion etching, may be performed to remove the oxidized region 30 on top of the wafer. The silicon channel region 30, having a thickness of less than approximately 20 nm and in certain embodiments between about 5 to about 10 nm, is formed on the post 24 of the BOX layer 14.

Figure 9:
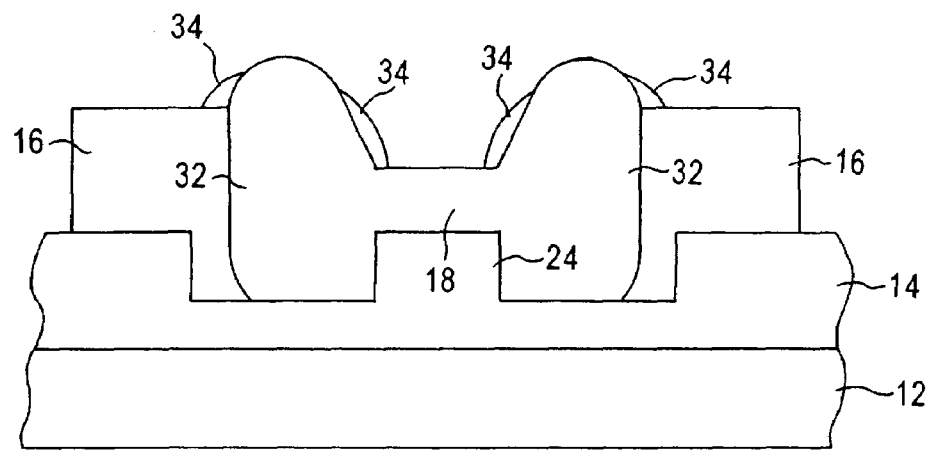

In FIG. 9, spacers 34 have been formed on the silicon deep source/drain regions 32 and in the gate recess 28. This may be accomplished by conventional sidewall spacer techniques, such as depositing a layer of dielectric material and than performing etching to leave sidewall spacers behind. Any of a number of suitable materials may be employed, such as nitride, silicon oxynitride, silicon carbide, low k dielectric materials, etc.

Figure 10:
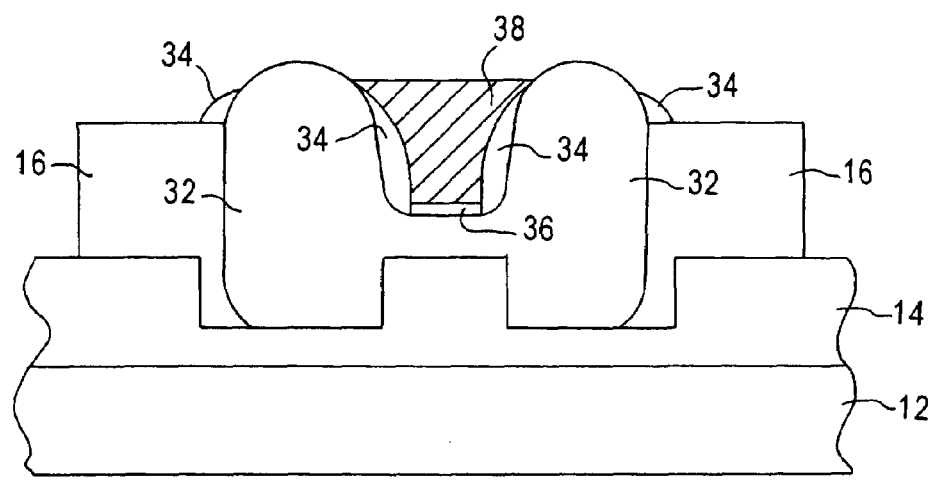

FIG. 10 shows the structure of FIG. 9, following the formation of the gate 38. Initially, a gate dielectric 36 is formed within the gate recess 28 by conventional gate dielectric formation techniques. The gate dielectric may be a conventional gate dielectric, such as silicon oxide, or a high k gate dielectric.

Following the formation of the gate dielectric 36 within the gate recess 28, a gate 38 is formed on the gate dielectric 36. The gate 38 may be made of metal, for example. To form a metal gate 38, a layer of metal is deposited, for example, and then polished. The remaining metal may be removed from the STI regions 16 by use of a field cleaning mask. However, some of the metal may be allowed to remain on the isolation regions 16 if desired for local interconnect purposes. Exemplary materials for the gate 38 include Ta, Al, TaSiN, which are suitable for NMOS structures. Other materials may include Ru, $RuO_2$, Ni, Pt, and Pd for PMOS structures. Other materials may be used without departing from the scope of the invention. A heavy metal is preferred as the gate material for the gate 38 as such metal has a much better implant stopping power that enables deep source and drain regions to be formed.

Figure 11:
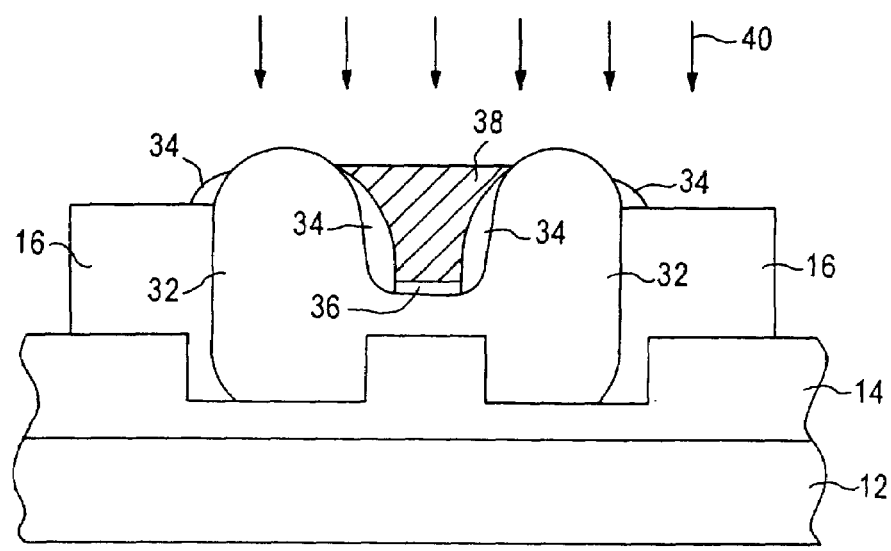

In FIG. 11 an implantation process is performed to implant dopants 40 into the deep source/drain regions 32. Conventional implantation energies and dosages may be employed and selected by one of ordinary skill in the art to achieve a desired doping profile and concentration. Activation of the dopants may be performed at temperatures of approximately 1000 to 1025° C. for between about 5–10".

Hence, the final structure depicted in FIG. 11 includes a fully depleted SOI arrangement having a silicon channel region 30 that is less than approximately 20 nm (between about 5–10 nm in certain embodiments), and has deep source/drain regions along with a metal gate in certain embodiments. Such an arrangement therefore achieves the advantages of fully depleted SOI devices and can be constructed in a production worthy process.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a fully depleted semiconductor-on-insulator (SOI) MOSFET arrangement, comprising the steps of:

forming a mask on a silicon layer of an SOI precursor having a buried oxide (BOX) layer and the silicon layer directly on and contacting the BOX layer;

etching the silicon layer and a portion of the BOX layer in accordance with the mask to create recessed regions and a post in the BOX layer;

forming a silicon channel region directly on and contacting the post in the BOX layer and silicon source/drain regions in the recesses;

forming a gate on the silicon channel region; and implanting dopants into the silicon source/drain regions.

2. The method of claim 1, wherein the silicon channel region is less than about 20 nm thick.

3. The method of claim 2, wherein the silicon channel region is less than about 10 nm thick.

4. The method of claim 3, wherein the step of forming a silicon channel region directly on and contacting the post in the BOX layer and silicon source/drain regions in the recesses includes masking the silicon layer underneath the mask during etching of the silicon and epitaxially growing silicon on sides of the post and the silicon layer underneath the mask, and on the mask.

5. The method of claim 4, wherein the step of forming a silicon channel region directly on and contacting the post in the BOX layer and silicon source/drain regions in the recesses include polishing the silicon on the mask and stopping the polishing on the mask.

6. The method of claim 5, further comprising removing the mask after the polishing of the silicon to create a gate recess.

7. The method of claim 6, further comprising oxidizing the silicon to form oxide and removing the oxide from portions of the silicon extending above the BOX layer.

8. The method of claim 7, wherein the step of forming a gate includes forming spacers in the gate recess and on the silicon above the BOX layer.

9. The method of claim 8, wherein the step of forming a gate includes forming a gate dielectric in the gate recess and depositing gate material in the gate recess on the gate dielectric.

10. The method of claim 9, wherein the gate material is a metal.

11. The method of claim 10, wherein the metal is at least one of: Ta, Al, TaSiN, Ru, $RuO_2$, Ni, Pt, Pd.

* * * * *

UNITED STATES PATENT AND TRADEMARK OFFICE
CERTIFICATE OF CORRECTION

| | | |
|---|---|---|
| PATENT NO. | : 7,202,118 B1 | Page 1 of 1 |
| APPLICATION NO. | : 10/460402 | |
| DATED | : April 10, 2007 | |
| INVENTOR(S) | : Zoran Krivokapic | |

It is certified that error appears in the above-identified patent and that said Letters Patent is hereby corrected as shown below:

TITLE PAGE,

Item "(56) References Cited", in the listing of "U.S. PATENT DOCUMENTS", change "6,717,216 B1 * 4/2004 Baie et al. ......257/347" to -- 6,717,216 B1 * Doris et al. ........257/347 --.

Signed and Sealed this

Tenth Day of July, 2007

JON W. DUDAS
*Director of the United States Patent and Trademark Office*